United States Patent
Wang et al.

(10) Patent No.: US 11,309,166 B2
(45) Date of Patent: Apr. 19, 2022

(54) METHODS FOR FABRICATING GAS DISCHARGE TUBES

(71) Applicant: Bourns, Inc., Riverside, CA (US)

(72) Inventors: Zuoyi Wang, Riverside, CA (US); Peter Shak, Riverside, CA (US); Gordon L. Bourns, Riverside, CA (US)

(73) Assignee: Bourns, Inc., Riverside, CA (US)

( * ) Notice: Subject to any disclaimer, the term of this patent is extended or adjusted under 35 U.S.C. 154(b) by 0 days.

(21) Appl. No.: 17/326,105

(22) Filed: May 20, 2021

(65) Prior Publication Data
US 2021/0272773 A1    Sep. 2, 2021

Related U.S. Application Data (62) Division of application No. 15/990,965, filed on May 29, 2018, now Pat. No. 11,081,319.

(Continued)

(51) Int. Cl.
*H01J 9/26* (2006.01)
*H01T 4/12* (2006.01)
(Continued)

(52) U.S. Cl.
CPC ............ *H01J 37/3255* (2013.01); *H01J 5/20* (2013.01); *H01J 9/26* (2013.01); *H01J 9/265* (2013.01);
(Continued)

(58) Field of Classification Search
CPC .... H01J 9/265; H01J 17/16; H01J 5/20; H01J 5/26; H01T 4/12
See application file for complete search history.

(56) References Cited

U.S. PATENT DOCUMENTS

| 4,061,939 A | ‡ | 12/1977 | Strok, Jr. | ............... | H01J 61/34 |
| | | | | | 313/25 |
| 5,506,071 A | ‡ | 4/1996 | Tanaka | .................. | H01C 1/024 |
| | | | | | 361/118 |

(Continued)

FOREIGN PATENT DOCUMENTS

| GB | 2138802 A | ‡ | 10/1984 | ............. | C04B 35/44 |
| WO | WO-2014-130838 A1 | ‡ | 8/2014 | ............ | H01J 61/305 |
| WO | WO-2016-149553 A1 | ‡ | 9/2016 | ............... | H01T 1/20 |

OTHER PUBLICATIONS

Supplementary Partial European Search Report dated Jun. 2, 2021, for European Patent Application No. 18809052.6, Titled "Glass Sealed Gas Discharge Tubes".‡

(Continued)

*Primary Examiner* — Joseph L Williams
(74) *Attorney, Agent, or Firm* — Chang & Hale LLP (57) ABSTRACT

Methods for fabricating gas discharge tubes. In some embodiments, a method for fabricating a gas discharge tube (GDT) device can include providing or forming an insulator substrate having first and second sides and defining an opening. The method can further include providing or forming a first electrode and a second electrode. The method can further include forming a first glass seal between the first electrode and the first side of the insulator substrate, and a second glass seal between the second electrode and the second side of the insulator substrate, such that the first and second glass seals provide a hermetic seal for a chamber defined by the opening and the first and second electrodes.

20 Claims, 8 Drawing Sheets

Related U.S. Application Data

(60) Provisional application No. 62/512,163, filed on May 29, 2017.

(51) Int. Cl.
| | | |
|---|---|---|
| *H01J 37/32* | (2006.01) | |
| *H01J 17/18* | (2012.01) | |
| *H01J 17/64* | (2006.01) | |
| *H01J 17/16* | (2012.01) | |
| *H01J 5/20* | (2006.01) | |

(52) U.S. Cl.
CPC ............ *H01J 17/16* (2013.01); *H01J 17/183* (2013.01); *H01J 17/64* (2013.01); *H01J 37/32541* (2013.01); *H01J 37/32559* (2013.01)

(56) References Cited

U.S. PATENT DOCUMENTS

| | | | | |
|---|---|---|---|---|
| 2004/0256975 | A1‡ | 12/2004 | Gao | ................. B82Y 10/00 313/495 |
| 2006/0055500 | A1‡ | 3/2006 | Burke | ................. H01C 17/281 338/22 R |
| 2014/0184064 | A1‡ | 7/2014 | Chang | ................. H01J 7/44 315/41 |

OTHER PUBLICATIONS

Written Opinion dated Oct. 31, 2018 for PCT/US2018/034835.‡
International Search Report dated Oct. 31, 2018 for PCT/US2018/034835.‡

‡ imported from a related application

METHODS FOR FABRICATING GAS DISCHARGE TUBES

CROSS-REFERENCE TO RELATED APPLICATION(S)

This application is a division of U.S. application Ser. No. 15/990,965 filed May 29, 2018, entitled GLASS SEALED GAS DISCHARGE TUBES, which claims priority to and the benefit of the filing date of U.S. Provisional Application No. 62/512,163 filed May 29, 2017, entitled GLASS SEALED GAS DISCHARGE TUBES, the benefits of the filing dates of which are hereby claimed and the disclosures of which are hereby expressly incorporated by reference herein in their entirety.

BACKGROUND

Field

The present disclosure relates to gas discharge tubes and related devices and methods.

Description of the Related Art

A gas discharge tube (GDT) is a device having a volume of gas confined between two electrodes. When sufficient potential difference exists between the two electrodes, the gas can ionize to provide a conductive medium to thereby yield a current in the form of an arc.

Based on such an operating principle, GDTs can be configured to provide reliable and effective protection for various applications during electrical disturbances. In some applications, GDTs can be preferable over semiconductor discharge devices due to properties such as low capacitance and low insertion/return losses. Accordingly, GDTs are frequently used in telecommunications and other applications where protection against electrical disturbances such as overvoltages is desired.

SUMMARY

In some implementations, the present disclosure relates to a gas discharge tube (GDT) device that includes an insulator substrate having first and second sides and defining an opening, and a first electrode implemented to cover the opening on the first side of the insulator substrate, and a second electrode implemented to cover the opening on the second side of the insulator substrate. The GDT device further includes a first glass seal implemented between the first electrode and the first side of the insulator substrate, and a second glass seal implemented between the second electrode and the second side of the insulator substrate, such that the first and second glass seals provide a hermetic seal for a chamber defined by the opening and the first and second electrodes.

In some embodiments, the insulator substrate can include a ceramic substrate. In some embodiments, each of the first and second electrode can include a copper material.

In some embodiments, each of the first and second glass seals can include a reflowed glass layer. The reflowed glass layer can include glass material from a glass layer that was on the respective side of the insulator substrate and the corresponding electrode.

In some embodiments, the GDT device can further include a gas or a gas mixture substantially contained within the chamber. In some embodiments, each of the first and second glass seal can include or be based on a silica compound. The silica compound can include, for example, silicon dioxide or quartz.

In some implementations, the present disclosure relates to a method for fabricating a gas discharge tube (GDT) device. The method includes providing or forming an insulator substrate having first and second sides and defining an opening, and applying a glass layer around the opening on each of the first and second sides of the insulator substrate. The method further includes providing or forming a first electrode and a second electrode, and applying a glass layer on each of the first and second electrodes. The method further includes forming an assembly of the first electrode on the first side of the insulator substrate and the second electrode on the second side of the insulator substrate, such that the glass layer on each electrode engages the glass layer on the corresponding side of the insulator substrate. The method further includes heating the assembly to melt the glass layer on each electrode and the glass layer on the corresponding side of the insulator substrate and yield a reflowed glass seal.

In some embodiments, the applying of the glass layer around the opening on each side of the insulator substrate, and the applying of the glass layer on each of the first and second electrodes can include a sintering step.

In some embodiments, the reflowed glass seal can provide a hermetic seal for a chamber defined by the opening and the first and second electrodes. In some embodiments, the method can further include providing a desired gas during at least a portion of the heating such that the hermetically sealed chamber contains the desired gas.

In some embodiments, the method can further include cooling the assembly after the formation of the reflowed glass seal. In some embodiments, the GDT can be one of a plurality of GDTs joined by an insulator sheet that defines an array of insulator substrates. In some embodiments, the method can further include singulating the insulator sheet yield a plurality of individual GDTs. Such singulating can be performed after the cooling of the assembly.

In some implementations, the present disclosure relates to an assembly of gas discharge tubes (GDTs). The assembly can include an insulator sheet having a plurality of units defined by respective boundaries, with each unit including an insulator substrate having first and second sides and defining an opening. The assembly can further include a plurality of first electrodes, with each implemented to cover the opening of the respective unit on the first side of the insulator substrate, and a plurality of second electrodes, with each implemented to cover the opening of the respective unit on the second side of the insulator substrate. The assembly can further include a plurality of first glass seals, with each implemented between the first electrode and the first side of the insulator substrate of the respective unit, and a plurality of second glass seal, with each implemented between the second electrode and the second side of the insulator substrate of the respective unit, such that the first and second glass seals provide a hermetic seal for a chamber defined by the opening and the first and second electrodes of the respective unit.

In some embodiments, the plurality of units can be arranged in an array. At least some of the boundaries can be configured to allow singulation of the array of units into separate singulated units.

In some implementations, the present disclosure relates to a method for fabricating gas discharge tube (GDT) devices. The method includes providing or forming an insulator sheet having a plurality of units defined by respective boundaries, with each unit including an insulator substrate having first and second sides and defining an opening. The method further includes applying a glass layer around the opening on the first side of the insulator substrate of each unit, and applying a glass layer around the opening on the second side of the insulator substrate of each unit. The method further includes providing or forming a plurality of first electrodes and a plurality of second electrodes, and applying a glass layer on each of the first electrodes and each of the second electrodes. The method further includes assembling the first electrodes on the first side of the insulator sheet and the second electrodes on the second side of the insulator sheet, such that the glass layer on each electrode engages the glass layer on the corresponding side of the insulator substrate of the respective unit.

In some embodiments, the method can further include heating the assembly to melt the glass layer on each electrode and the glass layer on the corresponding side of the insulator substrate of the respective unit and yield a reflowed glass seal that provides a hermetic seal for a chamber defined by the opening and the first and second electrodes of the respective unit. The method can further include providing a desired gas during at least a portion of the heating such that each hermetically sealed chamber contains the desired gas. The method can further include cooling the assembly after the formation of the reflowed glass seal for each unit. The method can further include singulating the insulator sheet yield a plurality of individual GDTs.

In some implementations, the present disclosure relates to an electrical device having a gas discharge tube (GDT) that includes an insulator substrate having first and second sides and defining an opening, and a first electrode implemented to cover the opening on the first side of the insulator substrate, and a second electrode implemented to cover the opening on the second side of the insulator substrate. The GDT further includes a first glass seal implemented between the first electrode and the first side of the insulator substrate, and a second glass seal implemented between the second electrode and the second side of the insulator substrate, such that the first and second glass seals provide a hermetic seal for a chamber defined by the opening and the first and second electrodes. The electrical device further includes an electrical component electrically connected to the GDT.

In some embodiments, the electrical connection between the GDT and the electrical component can be configured such that the electrical device is a single packaged unit.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

FIGS. 10A, 10B, 100, 10D and 10E show an example of how an array of electrodes can be kept together while undergoing a number of process steps involving the sheet assembly resulting from FIGS. 8A-8C.

DETAILED DESCRIPTION OF SOME EMBODIMENTS

The headings provided herein, if any, are for convenience only and do not necessarily affect the scope or meaning of the claimed invention.

Described herein are examples related to gas discharge tubes (GDTs) having glass seals. In some embodiments, a GDT can include an insulator layer such as a ceramic substrate, and such an insulator layer can define an opening that will become a sealed chamber. Such an opening can be covered with an electrode on each of the two sides of the insulator layer. A glass seal can be formed between each electrode and the corresponding surface of the insulator layer, at or near the perimeter of the opening, so as to form the sealed chamber. Various examples of how such a glass sealed GDT can be formed are described herein in greater detail.

FIGS. 1-4 show an example process for manufacturing a glass sealed GDT. FIG. 1A shows a ceramic substrate 102 having an opening 101 that will become a sealed chamber. For the purpose of description, the ceramic substrate 102 can include a first side and a second side, and each of the two sides is shown to include a surface about the opening 101. For example, the first side can be the lower side, and the second side can be the upper side, of the ceramic substrate 102 as shown in FIG. 1A. Although various examples are described herein in the context of an insulator layer being a ceramic substrate, it will be understood that one or more features of the present disclosure can also be implemented utilizing other types of electrically insulating substrates.

Figure 1A:
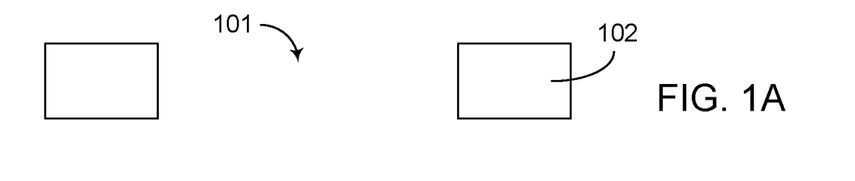
FIG. 1A shows a ceramic substrate having an opening that will become a sealed chamber.
Figure 1B:
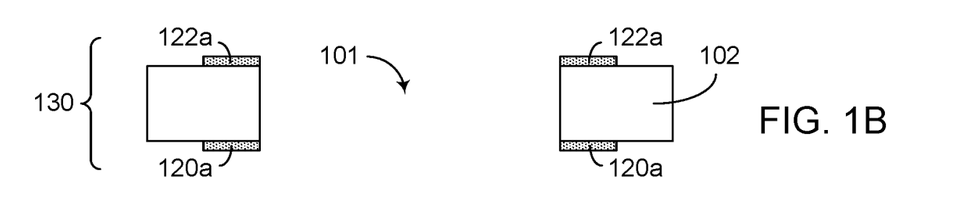
FIG. 1B shows a glass layer being applied to each of the first and second sides of the ceramic substrate.

FIG. 1B shows a glass layer being applied to each of the first and second sides of the ceramic substrate 102. More particularly, a glass layer 120a is shown to be applied to the first side of the ceramic substrate 102, and a glass layer 122a is shown to be applied to the second side of the ceramic substrate 102. In some embodiments, such application of the glass layers 120a, 122a can be achieved in sequence (e.g., apply the glass layer 120a to the upward facing first surface of the ceramic substrate 102, invert the ceramic substrate 102 so that the second surface faces upward, and apply the glass layer 122a to the second surface), generally at the same time, or some combination thereof. In some embodiments, the first and second sides of the ceramic substrate 102 can be substantially the same, and the corresponding glass layers can also be substantially the same.

In some embodiments, the glass layers 120a, 122a can be formed around the opening 101 of the ceramic substrate 102, be pre-formed in a shape of a perimeter of the opening 101 of the ceramic substrate 102, etc. Once positioned on the respective surfaces of the ceramic substrate 102, the glass layers 120a, 122a can be sintered in, for example, a furnace with appropriate temperature and atmospheric profile for an appropriate time. In the example of FIG. 1B, an assembly of the ceramic substrate 102 with the glass layers 120a, 122a sintered on the first and second sides is indicated as 130.

Figure 2A:
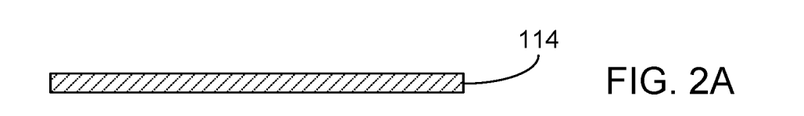
FIG. 2A shows a first electrode that will cover the opening on the first side of the ceramic substrate.

FIG. 2A shows a first electrode 114 that will cover the opening 101 on the first side of the ceramic substrate 102 of FIG. 1B. For the purpose of description, the first electrode 114 can include a first side and a second side, and be dimensioned to cover the opening 101 on the corresponding side of the ceramic substrate 102. Also for the purpose of description, the first side of the first electrode 114 can be the side that faces inward into the opening 101, and the second side of the first electrode 114 can be the side that faces outward away from the opening 101. In some embodiments, such an electrode can be, for example, a copper electrode, and such a copper electrode can be oxidized.

Figure 2B:
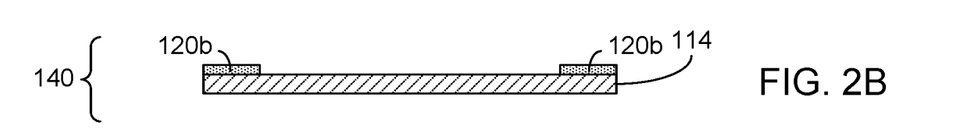
FIG. 2B shows a glass layer being applied to a side of the oxidized first electrode.

FIG. 2B shows a glass layer 120b being applied to the first side of the oxidized first electrode 114. In some embodiments, the glass layer 120b can be formed around a perimeter of the first side of the first electrode 114, be pre-formed in a shape of the perimeter of the first electrode 114, etc. Once positioned on the first side of the first electrode 114, the glass layer 120b can be sintered in, for example, a furnace with appropriate temperature and atmospheric profile for an appropriate time. In the example of FIG. 2B, an assembly of the first electrode 114 with the glass layer 120b sintered on the first side is indicated as 140.

In some embodiments, an emissive coating can be applied on the first side of the first electrode 114. In some embodiments, such an emissive coating can be positioned at or near the center portion of the first electrode 114.

Figure 3A:
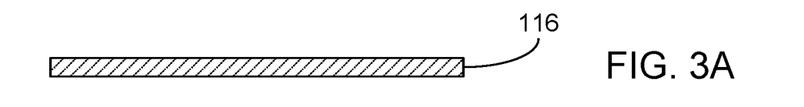
FIG. 3A shows a second electrode that will cover the opening on the second side of the ceramic substrate.
Figure 3B:
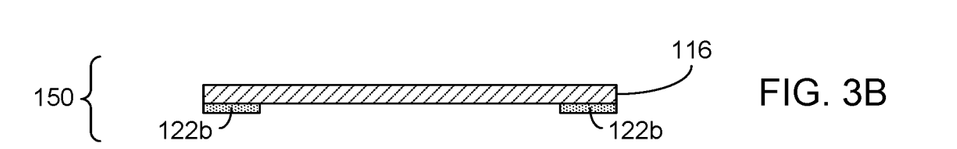
FIG. 3B shows a glass layer being applied to a side of the oxidized second electrode.

FIGS. 3A and 3B show a glass layer 122b applied to a first side of a second electrode 116 so as to yield an assembly 150, similar to the example described above in reference to FIGS. 2A and 2B. In some embodiments, the assembly 150 of FIG. 3B can be generally the same as the assembly 140 of FIG. 2B. However, it will be understood that such electrode assemblies can be different.

Figure 4A:
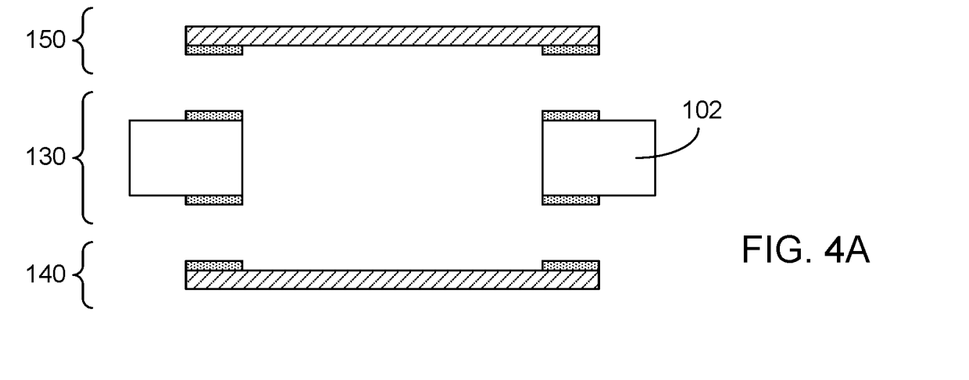
FIG. 4A shows an unassembled view of the assembly of FIG. 1B positioned to allow mating of the first electrode assembly of FIG. 2B on the first side, and to allow mating of the second electrode assembly of FIG. 3B on the second side.
Figure 4B:
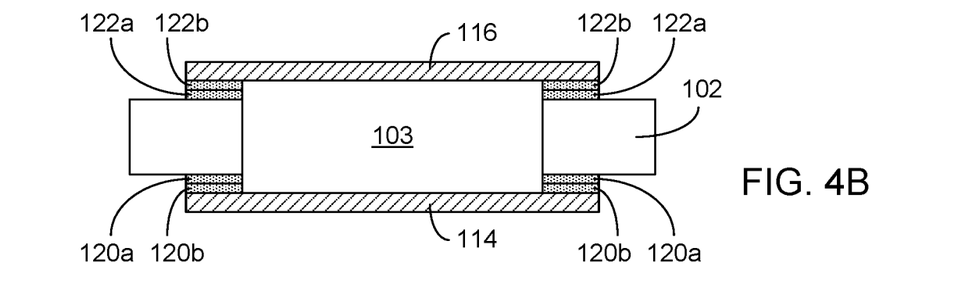
FIG. 4B shows an assembled view of the arrangement of the three assemblies of FIG. 4A.
Figure 4C:
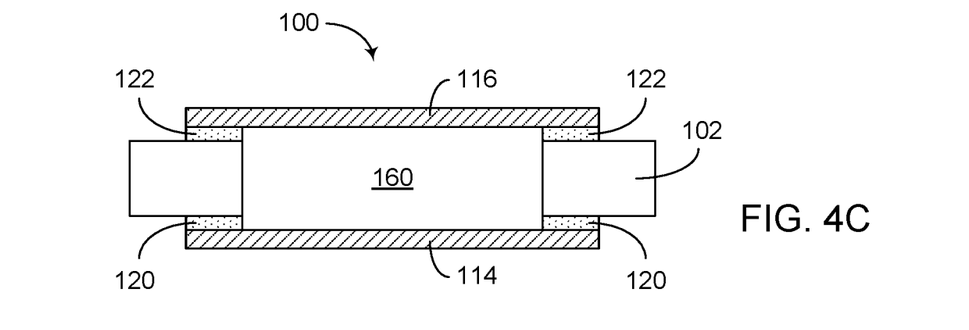
FIG. 4C shows a further processed stage in which a reflowed hermetic glass seal is formed on each of the first and second sides of the ceramic substrate.

FIGS. 4A-4C show an example of how the assemblies 130, 140, 150 of FIGS. 1B, 2B, 3B, respectively, can be assembled to produce a GDT having one or more features as described herein. In FIG. 4A, the assembly 130 having the ceramic substrate 102 with the glass layers (120a, 122a) of FIG. 1B is shown to be positioned to allow mating of the first electrode assembly 140 (with the glass layer 120b on the first electrode 114) of FIG. 2B on the first side of the ceramic substrate 102, and to allow mating of the second electrode assembly 150 (with the glass layer 122b on the second electrode 116) of FIG. 3B on the second side of the ceramic substrate 102.

FIG. 4B shows an assembled view of the foregoing arrangement of the assemblies 130, 140, 150 of FIG. 4A. More particularly, on the first side of the ceramic substrate 102, the glass layer 120a associated with the ceramic substrate 102 is shown to mate with the glass layer 120b associated with the first electrode 114. Similarly, on the second side of the ceramic substrate 102, the glass layer 122a associated with the ceramic substrate 102 is shown to mate with the glass layer 122b associated with the second electrode 116. In FIG. 4B, such an assembled arrangement is shown to form an enclosed volume 103 defined by the opening of the ceramic substrate 102, and the first and second electrodes 114, 116.

In some embodiments, the assembly of FIG. 4B can be placed in a furnace and be provided with appropriate temperature and atmospheric condition to cure the emissive coating (if present) on one or both of the electrodes 114, 116. After such a curing process, air and outgases from the emissive coating curing process can be evacuated, and the furnace can be flooded with a desired gas or gas mixture (e.g., argon, neon, or other gas mixture), and an appropriate temperature can be provided so as to melt the glass layers (120a, 120b, 122a, 122b in FIG. 4B) and allow such glass layers to reflow together to form a hermetic glass seal on each of the first and second sides of the ceramic substrate 102.

In FIG. 4C, such a reflowed hermetic glass seal is indicated as 120 on the first side of the ceramic substrate 102, and as 122 on the second side of the ceramic substrate 102. In some embodiments, an assembly having such reflowed hermetic glass seals can be cooled in the furnace according to an appropriate cooling profile to yield a glass sealed GDT 100. In such a hermetically sealed configuration, a sealed chamber 160 of the glass sealed GDT 100 includes the gas or gas mixture provided prior to the glass reflowing process.

In some embodiments, a glass sealed GDT having one or more features as described herein can be configured to have different chamber shapes and/or different outer shapes. For example, FIGS. 5A-5D show non-limiting examples of a glass sealed GDT 100 having one or more features as described herein. In each example depicted in an upper plan view, an electrode 116 is shown to be attached to the upper side of the ceramic substrate 102 with a glass seal 122. It will be understood that a lower electrode (114 in FIG. 4C) is attached to the lower side of the ceramic substrate 102 (with a glass seal 120) in a similar manner, so as to form the sealed chamber 160.

Figure 5A:
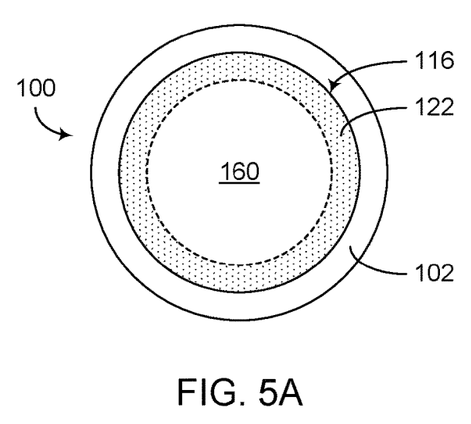
FIG. 5A shows an example of a glass sealed gas discharge tube, in which a sealed chamber as described herein can have a circular sectional shape to provide a cylindrical shaped sealed chamber, and such a sealed chamber can be covered by circular shaped electrodes and sealed with circular ring shaped glass seals.

FIG. 5A shows that in some embodiments, a sealed chamber 160 of a glass sealed GDT 100 can have a circular sectional shape to provide a cylindrical shaped sealed chamber 160, and such a sealed chamber can be covered by circular shaped electrodes (e.g., 116) and sealed with circular ring shaped glass seals (e.g., 122). In the example of FIG. 5A, the outer shape of the ceramic substrate 102 can also have a circular shape, such that the glass sealed GDT 100 has a generally cylindrical shape.

Figure 5B:
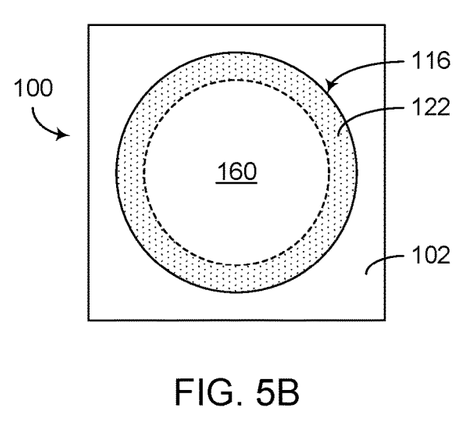
FIG. 5B shows another example of a glass sealed gas discharge tube, in which a sealed chamber as described herein can have a circular sectional shape to provide a cylindrical shaped sealed chamber, and such a sealed chamber can be covered by circular shaped electrodes and sealed with circular ring shaped glass seals.

FIG. 5B shows that in some embodiments, a sealed chamber 160 of a glass sealed GDT 100 can have a circular sectional shape to provide a cylindrical shaped sealed chamber 160, and such a sealed chamber can be covered by circular shaped electrodes (e.g., 116) and sealed with circular ring shaped glass seals (e.g., 122). In the example of FIG. 5B, the outer shape of the ceramic substrate 102 can have a rectangular shape (e.g., a square shape), such that the glass sealed GDT 100 generally has a box shape.

Figure 5C:
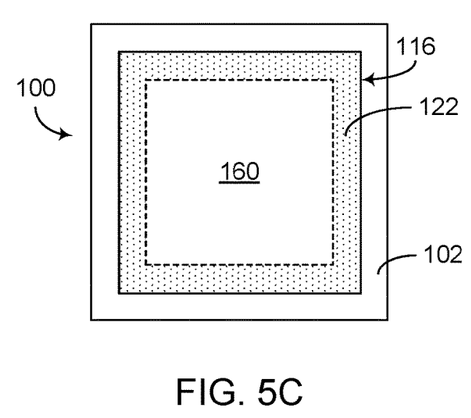
FIG. 5C shows that in some embodiments, a glass sealed gas discharge tube can include a sealed chamber having a rectangular sectional shape to provide a box shaped sealed chamber, and such a sealed chamber can be covered by rectangular shaped electrodes and sealed with rectangular ring shaped glass seals.

FIG. 5C shows that in some embodiments, a sealed chamber 160 of a glass sealed GDT 100 can have a rectangular sectional shape (e.g., a square shape) to provide a box shaped sealed chamber 160, and such a sealed chamber can be covered by rectangular shaped electrodes (e.g., 116) and sealed with rectangular ring shaped glass seals (e.g., 122). In the example of FIG. 5C, the outer shape of the ceramic substrate 102 can have a rectangular shape (e.g., a square shape), such that the glass sealed GDT 100 generally has a box shape.

Figure 5D:
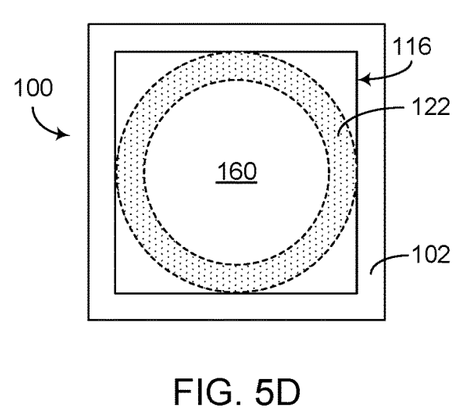
FIG. 5D shows that in some embodiments, a glass sealed gas discharge tube can include a sealed chamber having a circular sectional shape to provide a cylindrical shaped sealed chamber, and such a sealed chamber can be covered by rectangular shaped electrodes and sealed with circular ring shaped glass seals.

FIG. 5D shows that in some embodiments, a sealed chamber 160 of a glass sealed GDT 100 can have a circular sectional shape to provide a cylindrical shaped sealed chamber 160, and such a sealed chamber can be covered by rectangular shaped electrodes (e.g., 116) and sealed with circular ring shaped glass seals (e.g., 122). In the example of FIG. 5D, the outer shape of the ceramic substrate 102 can have a rectangular shape (e.g., a square shape), such that the glass sealed GDT 100 generally has a box shape.

It will be understood that the shape of the sealed chamber, the shape of the electrodes, the shape of the glass seals, and/or the shape of the ceramic substrate can have other configurations that are different from the non-limiting examples of FIGS. 5A-5D.

Figure 6:
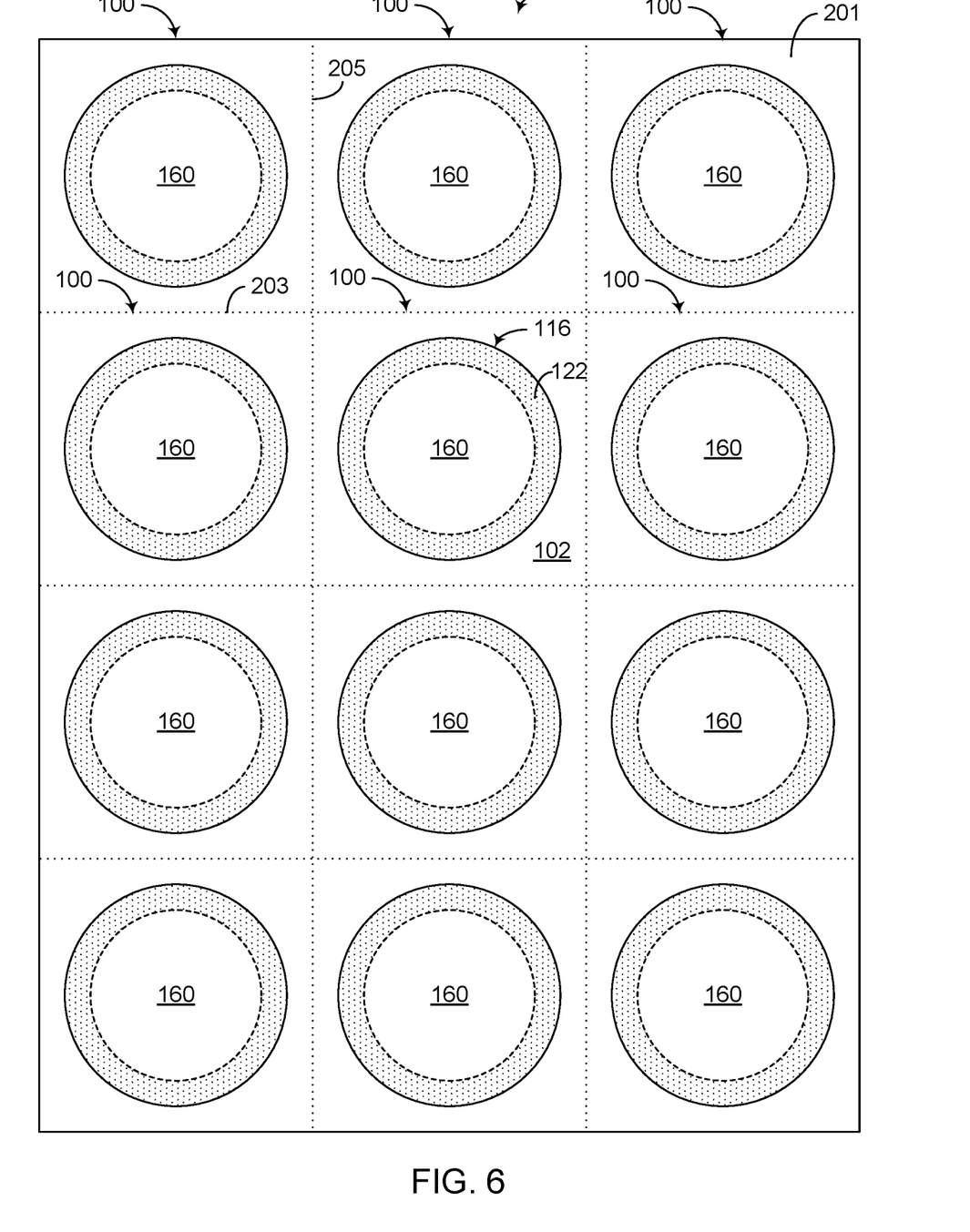
FIG. 6 shows an array of joined glass sealed gas discharge tubes formed on an insulator sheet such as a ceramic sheet.

In some embodiments, a plurality of glass sealed GDTs having one or more features as described herein can be produced together in an array format. For example, FIG. 6 shows an array 200 of joined glass sealed GDTs 100 formed on an insulator sheet 201 such as a ceramic sheet. Such a ceramic sheet can define boundaries 203, 205 that allow the joined glass sealed GDTs 100 to be singulated to yield a plurality of individual glass sealed GDTs. Each individual glass sealed GDT 100 is shown to include a ceramic substrate 102 and a sealed chamber 160 covered by electrodes (e.g., 116) and sealed by glass seals (e.g., 122).

In the example of FIG. 6, each glass sealed GDT 100 is depicted as being similar to the example of FIG. 5B. However, it will be understood that each glass sealed GDT 100 in the array 200 of FIG. 6 can have other shapes. An example of a fabrication process utilizing the array format of FIG. 6 is described in greater detail in reference to FIGS. 8 and 9.

Figure 7:
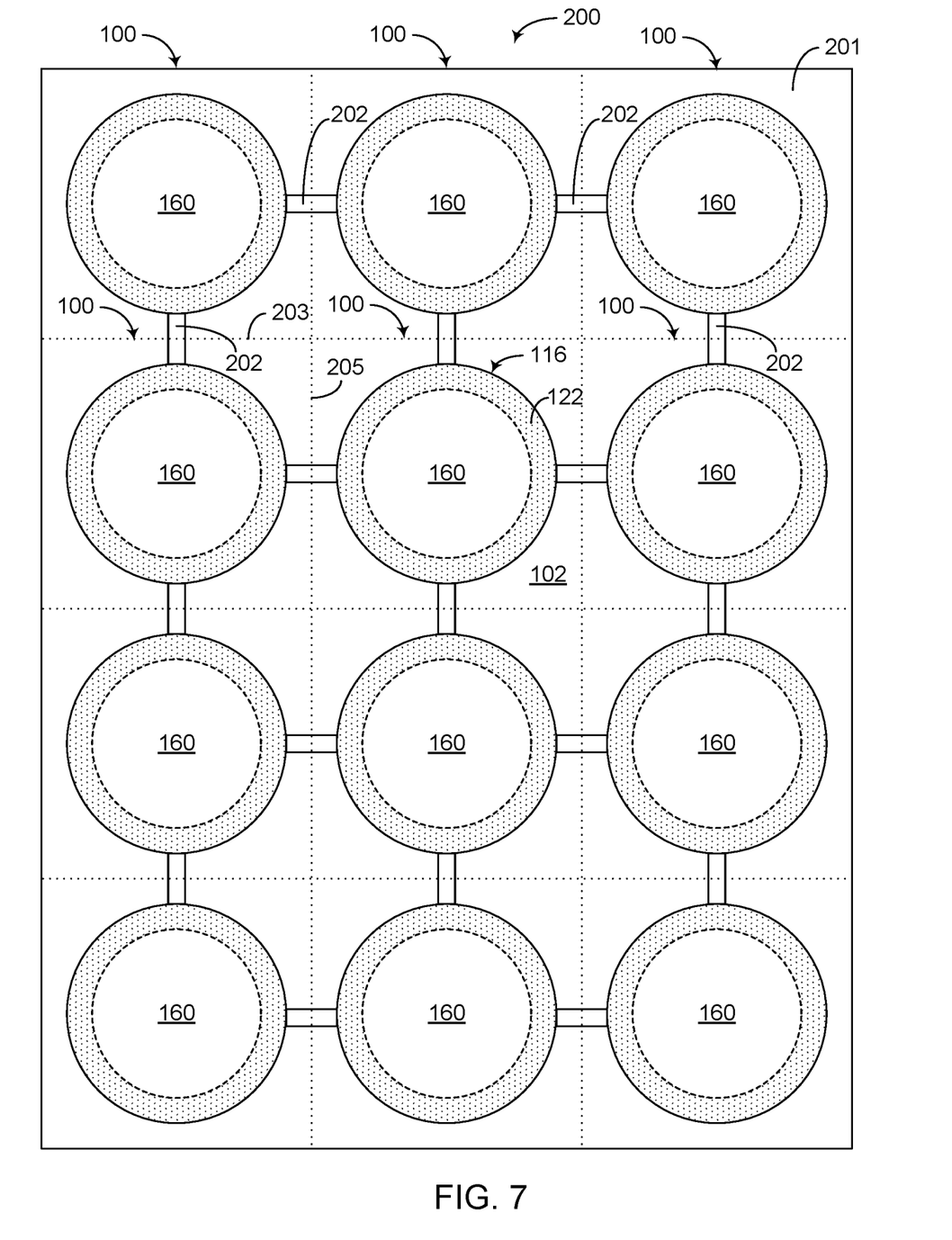
FIG. 7 shows another example in which an array of joined glass sealed gas discharge tubes can be formed on an insulator sheet such as a ceramic sheet.

FIG. 7 shows another example in which an array 200 of joined glass sealed GDTs 100 can be formed on an insulator sheet 201 such as a ceramic sheet. Such a ceramic sheet can define boundaries 203, 205 that allow the joined glass sealed GDTs 100 to be singulated to yield a plurality of individual glass sealed GDTs. Each individual glass sealed GDT 100 is shown to include a ceramic substrate 102 and a sealed chamber 160 covered by electrodes (e.g., 116) and sealed by glass seals (e.g., 122). In the example of FIG. 7, the electrodes 116 are depicted as being interconnected in an array by interconnecting tabs 202, so as to allow the array of electrodes 116 to be processed together.

In the example of FIG. 7, each glass sealed GDT 100 is depicted as being similar to the example of FIG. 5B. However, it will be understood that each glass sealed GDT 100 in the array 200 of FIG. 7 can have other shapes. An example of a fabrication process utilizing the array format of FIG. 7 is described in greater detail in reference to FIGS. 8 and 10.

Figure 8A:
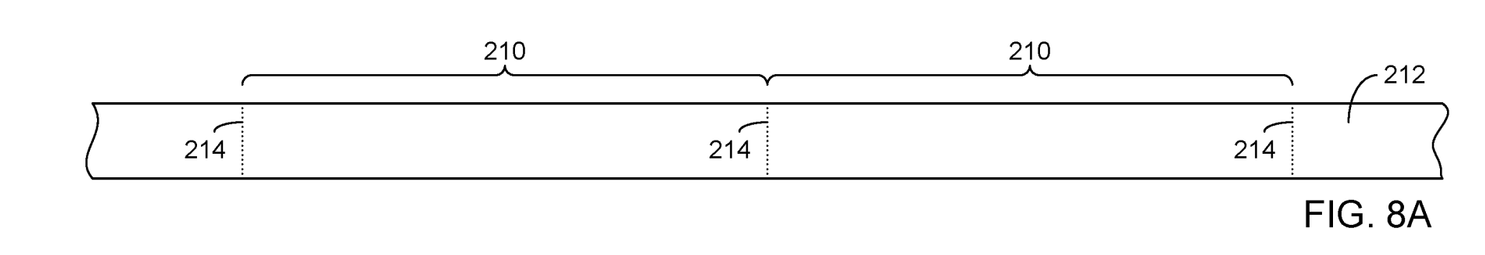
FIGS. 8A, 8B and 8C show an example of how a ceramic sheet can be processed to produce an array of joined units, with each unit being similar to the example of FIGS. 1A and 1B.
Figure 8B:
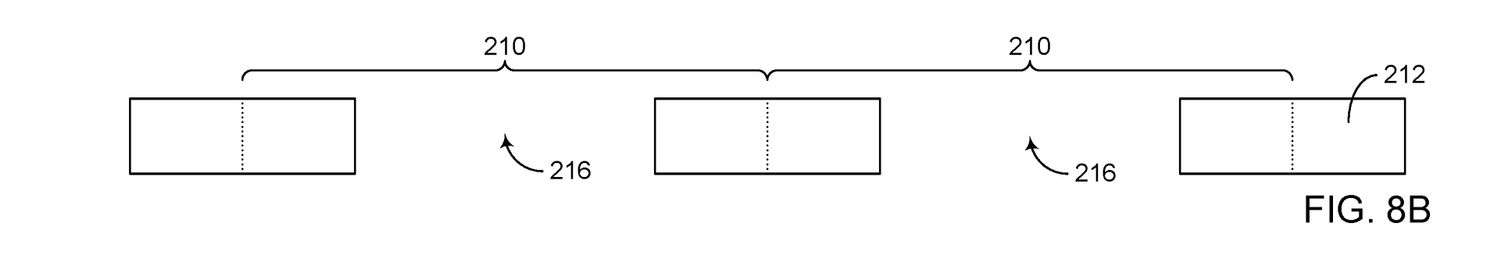
Figure 8C:
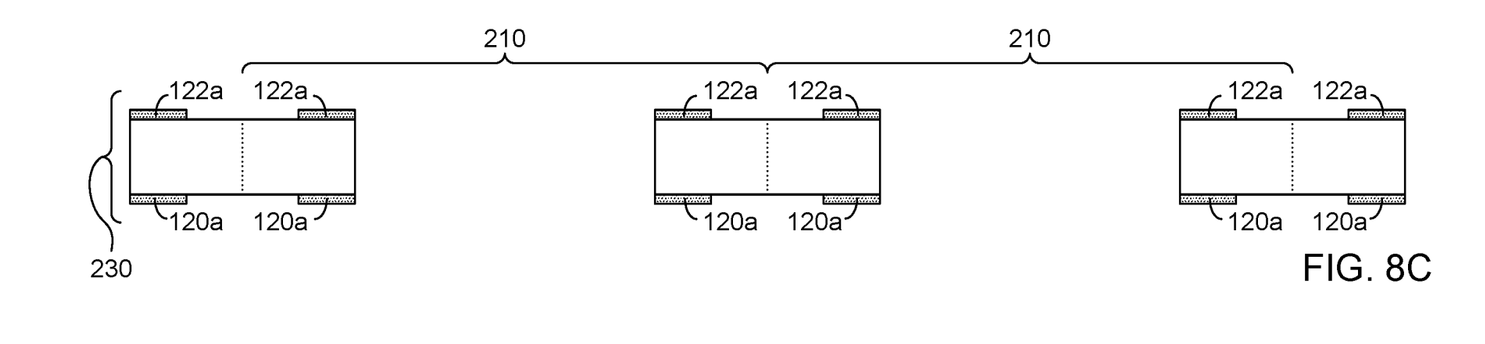

FIGS. 8A-8C show an example of how a ceramic sheet 212 can be processed to produce an array of joined units 210, with each unit being similar to the example of FIGS. 1A and 1B.

In FIG. 8A, a ceramic sheet 212 is shown to be provided. Such a sheet can include boundaries 214 that may or may not be marked, scored, etc., and such boundaries can define an array of joined units 210. As described herein, each of such joined units can become a separate individual unit upon singulation.

In FIG. 8B, an opening 216 is shown to be formed for each unit 210 of the ceramic sheet 212. In some embodiments, such openings can be formed utilizing, for example, drilling, punching, etching, and/or laser techniques. It will be understood that in some embodiments, a ceramic sheet can be initially formed with the openings; and in such an embodiment, the foregoing opening-forming step can be omitted.

In FIG. 8C, a glass layer 120a is shown to be provided on the first side of each unit 210 of the ceramic sheet 212, and a glass layer 122a is shown to be provided on the second side of each unit 210 of the ceramic sheet 212, to yield an assembly 230. In some embodiments, such glass layers can be formed individually for each unit 210, formed together for a plurality of units 210, or any combination thereof. In some embodiments, an array of glass layers can be interconnected, and such an array of glass layers can be applied on the corresponding side of the ceramic sheet 212 for the corresponding units 210. In some embodiments, the assembly 230 of the ceramic sheet 212 and the glass layers 120a, 122a on the first and second sides can be sintered similar to the example of FIG. 1B.

Figure 9A:
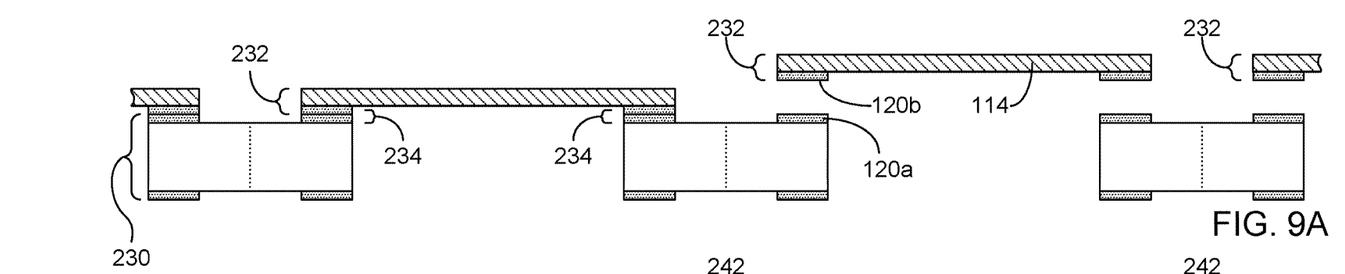
FIGS. 9A, 9B, 9C and 9D show an example of how electrodes can be provided to first and second sides of the sheet assembly resulting from FIGS. 8A, 8B and 8C.

FIGS. 9A-9D show an example of how electrodes can be provided to first and second sides of the assembly 230 of FIG. 8C. In FIG. 9A, an assembly 232 is shown to include an electrode 114 and a glass layer 120b, and such a glass layer is assumed to be provided on one side of the electrode 114, similar to the example of FIG. 2B. In the example of FIG. 9A, each of the assemblies 232 is shown to be positioned over the corresponding opening on the first side of the assembly 230, such that the glass layer 120b of the electrode 114 engages the glass layer 120a of the unit 210 of the assembly 230. In FIG. 9A, such an engagement of the glass layers (120a, 120b) is depicted as 234.

Figure 9B:
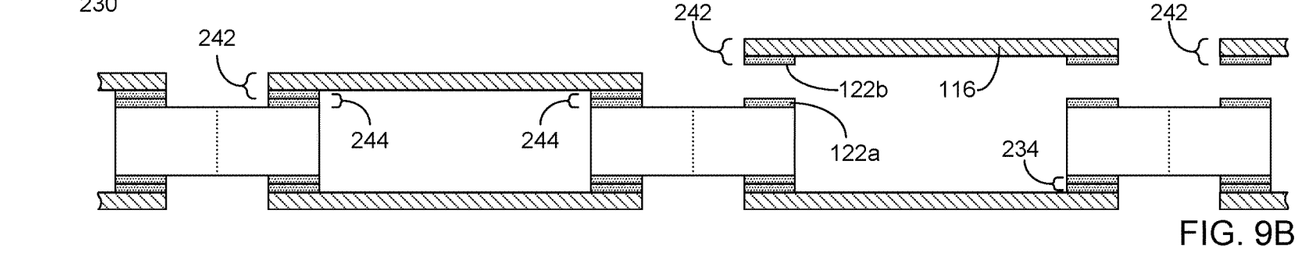

In FIG. 9B, an assembly 242 is shown to include an electrode 116 and a glass layer 122b, and such a glass layer is assumed to be provided on one side of the electrode 116, similar to the example of FIG. 3B. In the example of FIG. 9B, each of the assemblies 242 is shown to be positioned over the corresponding opening on the second side of the assembly 230, such that the glass layer 122b of the electrode 116 engages the glass layer 122a of the unit 210 of the assembly 230. In FIG. 9B, such an engagement of the glass layers (122*a*, 122*b*) is depicted as 244.

Figure 9C:
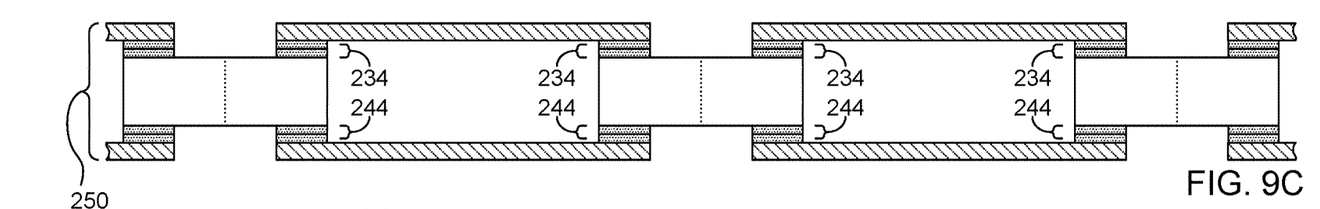

FIG. 9C shows an assembly 250 resulting from providing of the electrodes in FIGS. 9A and 9B. In some embodiments, such an assembly can be processed to reflow the glass layer assemblies 234, 244 and form corresponding hermetic glass seals, similar to the examples described herein in reference to FIGS. 4B and 4C. In some embodiments, such a reflow process can be performed before or after singulation of the assembly 250 into individual units.

In the example of FIG. 9C, the assembly 250 is depicted as being oriented so that the electrodes 114 and the corresponding glass layer assemblies 234 are again on the upper side of the assembly 230. It will be understood that such flipping of the assembly 250 may or may not be included. For example, if the electrodes 114 and 116 and corresponding glass layer assemblies (234, 244) are generally the same, or if orientation of the assembly 250 does not impact further processing of the assembly 250, the assembly 250 can remain in the orientation resulting from the stage of FIG. 9B.

Figure 9D:
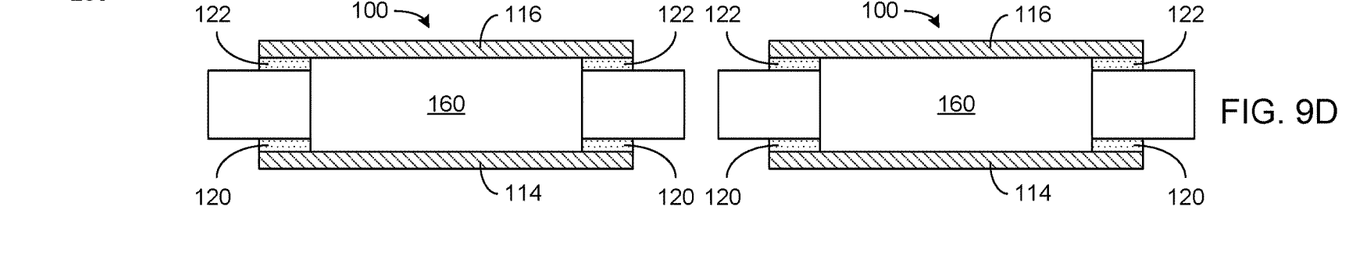

FIG. 9D shows a plurality of glass sealed GDTs 100, with each being similar to the example of FIG. 4C. Such glass sealed GDTs can result from the foregoing singulation of the assembly 250, before or after the reflow process resulting in the hermetic glass seals 120, 122.

In the examples described in reference to FIGS. 9A-9D, the electrode/glass layer assemblies 232, 242 can be fabricated in a number of ways. For example, each electrode/glass layer assembly (232 or 242) can be fabricated individually. In another example, an array of interconnected electrodes can be processed to provide a glass layer for each electrode, and upon completion of such providing of the glass layers, the electrode/glass layer assemblies can be separated into individual units for placement onto the ceramic sheet/glass layer assembly. In such a configuration, the glass layers can be provided to the interconnected electrodes by being interconnected themselves, individually, or some combination thereof.

Figure 10A:
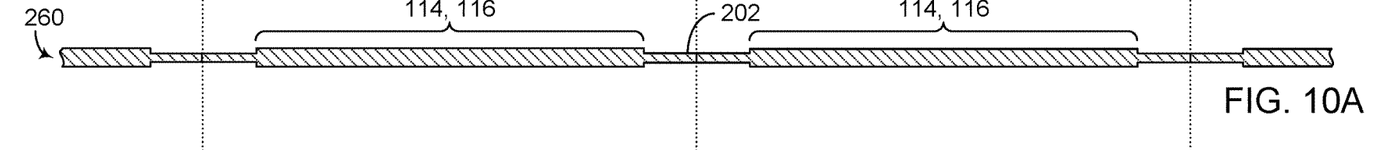

FIGS. 10A-10E show an example of how an array of electrodes can be kept together while undergoing a number of process steps. For example, FIG. 10A shows that in some embodiments, an array 260 of electrodes (114 or 116) can be interconnected with interconnecting features 202. Such an array of electrodes can be arranged to correspond with respective units (210) of a ceramic sheet assembly (e.g., 230 in FIG. 8C).

Figure 10B:
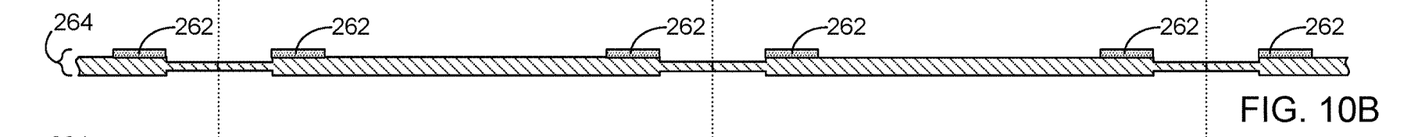
Figure 10C:
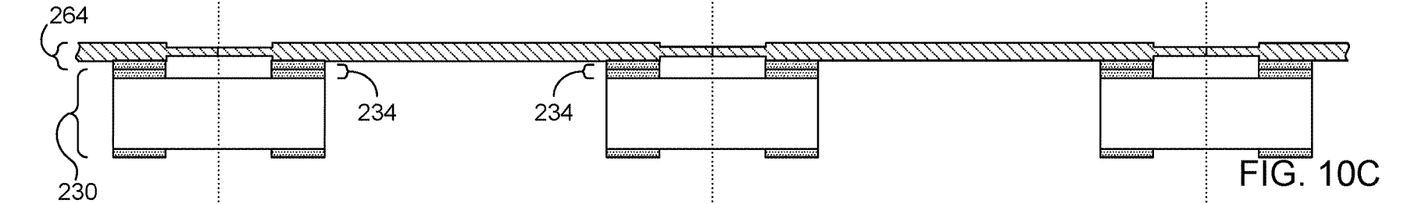

FIG. 10B shows that such an array of interconnected electrodes can be provided with glass layers. More particularly, a glass layer 262 can be provided to one side of each electrode to yield an assembly 264. It will be understood that such an assembly can be for an array of first electrodes (e.g., 114 in FIG. 2B) or an array of second electrodes (e.g., 116 in FIG. 3B). Further, and as described herein in reference to FIGS. 9A-9D, the glass layers 262 can be provided to the array of interconnected electrodes individually, in an interconnected array, or some combination thereof.

In FIG. 10O, the assembly 264 of FIG. 10B is shown to be positioned over the first side of the assembly 230 (e.g., of FIG. 8C), such that the glass layers 262 of the assembly 264 engage the corresponding glass layers (e.g., 120*a* in FIG. 8C) on the first side of the assembly 230. In FIG. 10O, such an engagement of the glass layers (262 of the assembly 264 and 120*a* of the assembly 230) is depicted as 234.

Figure 10D:
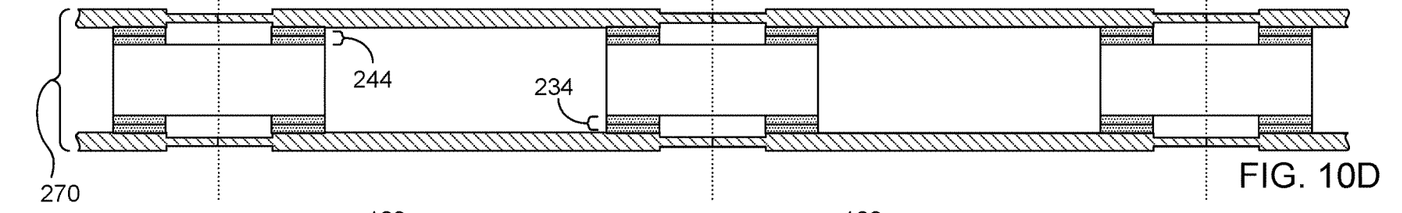

In FIG. 10D, another assembly similar to the assembly 264 of FIG. 10B is shown to be positioned over the second side of the assembly 230, such that the glass layers 262 of the other assembly engage the corresponding glass layers (e.g., 122*a* in FIG. 8C) on the second side of the assembly 230. In FIG. 10D, such an engagement of the glass layers (262 of the assembly 264 and 122*a* of the assembly 230) is depicted as 244, and the resulting assembly is indicated as an assembly 270. In some embodiments, such an assembly (270) can be processed to reflow the glass layer assemblies 234, 244 and form corresponding hermetic glass seals, similar to the examples described herein in reference to FIGS. 4B and 4C. In some embodiments, such a reflow process can be performed before or after singulation of the assembly 270 into individual units.

Figure 10E:
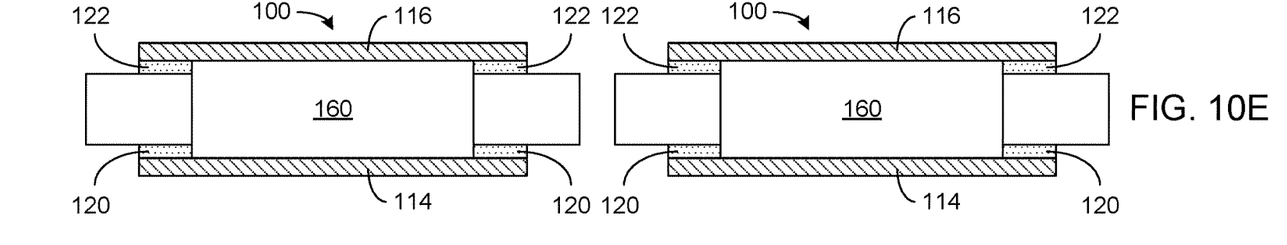

FIG. 10E shows a plurality of glass sealed GDTs 100, with each being similar to the example of FIG. 4C. Such glass sealed GDTs can result from the foregoing singulation of the assembly 270, before or after the reflow process. Upon the reflow process, the assemblies 234, 244 of glass layers form respective hermetic glass seals 120, 122, so as to provide a sealed chamber 160.

In the various examples described herein, an individual glass sealed GDT, whether fabricated individually, in an array, or some combination thereof, is depicted as having a single sealed chamber (e.g., 160 in 4C, 9D and 10E) with its own set of electrodes. It will be understood that in some embodiments, one or more features of the present disclosure can also be implemented in GDT devices having other configurations. For example, a GDT device can include a plurality of chambers, and such chambers can be glass sealed with one or more sets of electrodes. In another example, an electrical device can include a GDT having one or more features as described herein, and another component electrically coupled to the GDT. Among others, details concerning variations in GDT designs and packaging applications that can utilize one or more features of the present disclosure can be found in PCT Publication Number WO 2014/130838, which is hereby expressly incorporated by reference herein in its entirety, and its disclosure is to be considered part of the specification of the present application.

For the purpose of description, it will be understood that in some embodiments, a glass part such as a glass layer or a glass seal can include, for example, a material based on or including a compound silica such as silicon dioxide or quartz.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A method for fabricating a gas discharge tube (GDT) device, the method comprising:
    providing or forming an insulator substrate having first and second sides and defining an opening;
    providing or forming a first electrode and a second electrode; and
    forming a first glass seal between the first electrode and the first side of the insulator substrate, and a second glass seal between the second electrode and the second side of the insulator substrate, such that the first and second glass seals provide a hermetic seal for a chamber defined by the opening and the first and second electrodes.

2. The method of claim 1, wherein the forming of the first glass seal and the second glass seal includes providing a glass layer around the opening on each of the first and second sides of the insulator substrate, and providing a glass layer on each of the first and second electrodes.

3. The method of claim 2, wherein the providing of the glass layer around the opening on each side of the insulator substrate includes forming a glass layer around the opening or positioning a pre-formed glass layer having a shape of a perimeter of the opening.

4. The method of claim 2, wherein the providing of the glass layer on each of the first and second electrodes includes forming a glass layer around a perimeter of the electrode or positioning a pre-formed glass layer having a shape of a perimeter of the electrode.

5. The method of claim 2, wherein the providing of the glass layer around the opening on each side of the insulator substrate and the providing of the glass layer on each of the first and second electrodes include one or more sintering steps.

6. The method of claim 2, further comprising applying an emissive coating on an inward facing side of each of the first and second electrodes.

7. The method of claim 2, wherein the forming of the first glass seal and the second glass seal further includes forming an assembly of the first electrode on the first side of the insulator substrate and the second electrode on the second side of the insulator substrate, such that the glass layer on each electrode engages the glass layer on the corresponding side of the insulator substrate.

8. The method of claim 7, wherein the forming of the first glass seal and the second glass seal further includes heating the assembly to melt the glass layer on each electrode and the glass layer on the corresponding side of the insulator substrate, such that each of the first glass seal and the second glass seal includes a reflowed glass seal.

9. The method of claim 8, further comprising providing a desired gas during at least a portion of the heating of the assembly such that the hermetically sealed chamber contains the desired gas.

10. The method of claim 8, further comprising cooling the assembly after the formation of the reflowed glass seal for each of the first and second glass seals.

11. The method of claim 1, wherein the GDT is one of a plurality of GDTs joined by an insulator sheet that defines an array of insulator substrates.

12. The method of claim 11, further comprising singulating the insulator sheet to yield a plurality of individual GDTs.

13. The method of claim 12, wherein the singulating of the insulator sheet is performed after the forming of the first and second glass seals for each of the plurality of joined GDTs.

14. A method for fabricating a plurality of gas discharge tube (GDT) devices, the method comprising:
    providing or forming an insulator sheet having a plurality of units defined by respective boundaries, such that each unit includes an insulator substrate having first and second sides and defines a respective opening;
    providing or forming a plurality of first electrode and a plurality of second electrode; and
    forming a first glass seal between each first electrode and the first side of the insulator substrate of a respective unit, and a second glass seal between each second electrode and the second side of the insulator substrate of the respective unit, such that the first and second glass seals provide a hermetic seal for a chamber defined by the respective opening and the first and second electrodes.

15. The method of claim 14, wherein the plurality of first electrodes includes a plurality of individual first electrodes, and the plurality of second electrodes includes a plurality of individual second electrodes.

16. The method of claim 14, wherein the plurality of first electrodes includes an array of interconnected first electrodes, and the plurality of second electrodes includes an array of interconnected second electrodes.

17. The method of claim 16, wherein each of the array of interconnected first electrodes and the array of interconnected second electrodes is configured to allow the interconnected electrodes to be singulated from their respective array.

18. The method of claim 14, further comprising singulating the units into individual units, such that each individual unit having the hermetic sealed chamber is an individual GDT device.

19. A method for manufacturing an electrical device, the method comprising:
    fabricating a gas discharge tube by providing or forming an insulator substrate having first and second sides and defining an opening; providing or forming a first electrode and a second electrode; and forming a first glass seal between the first electrode and the first side of the insulator substrate, and a second glass seal between the second electrode and the second side of the insulator substrate, such that the first and second glass seals provide a hermetic seal for a chamber defined by the opening and the first and second electrodes; and electrically connecting an electrical component to the gas discharge tube.

20. The method of claim 19, wherein the electrical connecting includes assembling the gas discharge tube and the electrical component into a packaged device.

* * * * *